(12) United States Patent
Wong et al.

(10) Patent No.: US 7,557,424 B2
(45) Date of Patent: Jul. 7, 2009

(54) REVERSIBLE ELECTRIC FUSE AND ANTIFUSE STRUCTURES FOR SEMICONDUCTOR DEVICES

(75) Inventors: Keith Kwong Hon Wong, Wappingers Falls, NY (US); Chih-Chao Yang, Poughkeepsie, NY (US); Haining S Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 11/619,264

(22) Filed: Jan. 3, 2007

(65) Prior Publication Data

US 2008/0157269 A1 Jul. 3, 2008

(51) Int. Cl.
*H01L 23/58* (2006.01)
(52) U.S. Cl. ............... 257/529; 257/530; 257/E23.147; 257/E23.149; 438/131; 438/132
(58) Field of Classification Search ................. 257/499, 257/528, 529, 530, E23.146, E23.147, E23.148, 257/E23.149; 438/128, 131, 132, 142, 197, 438/199, 215, 281, 309, 333, 466, 467, 468, 438/469, 470, 584, 597, 598, 600, 601
See application file for complete search history.

(56) References Cited

U.S. PATENT DOCUMENTS

| | | | |
|---|---|---|---|
| 5,759,876 | A | 6/1998 | Singlevich et al. |
| 5,903,041 | A | 5/1999 | La Fleur et al. |
| 6,016,012 | A * | 1/2000 | Chatila et al. ................ 257/775 |
| 6,060,398 | A * | 5/2000 | Brintzinger et al. ......... 438/696 |
| 6,433,404 | B1 | 8/2002 | Iyer et al. |
| 6,506,660 | B2 | 1/2003 | Holmes et al. |
| 6,605,533 | B2 | 8/2003 | Trivedi |
| 6,750,129 | B2 | 6/2004 | Yang et al. |
| 6,956,772 | B2 | 10/2005 | Forbes |
| 2002/0038998 | A1 * | 4/2002 | Fujita et al. ................. 313/495 |
| 2003/0022483 | A1 * | 1/2003 | Shroff et al. ................ 438/637 |

(Continued)

FOREIGN PATENT DOCUMENTS

JP        2004-186590    *    7/2004

*Primary Examiner*—Evan Pert
*Assistant Examiner*—Kevin Quinto
(74) *Attorney, Agent, or Firm*—Rosa S. Yaghmour

(57) ABSTRACT

A structure and method of fabricating reversible fuse and antifuse structures for semiconductor devices is provided. In one embodiment, the method includes forming at least one line having a via opening for exposing a portion of a plurality of interconnect features; conformally depositing a first material layer over the via opening; depositing a second material layer over the first material layer, wherein the depositing overhangs a portion of the second material layer on a top portion of the via opening; and depositing a blanket layer of insulating material, where the depositing forms a plurality of fuse elements each having an airgap between the insulating material and the second material layer. The method further includes forming a plurality of electroplates in the insulator material connecting the fuse elements. In another embodiment, the method includes depositing a first and a second material layer on a semiconductor substrate, wherein the second material layer having a higher electrical conductivity than the first material layer; selectively etching the first and second material layer to create at least one constricted region to facilitate electromigration of the second material; wherein the electromigration creates a plurality of micro voids; and forming a plurality of electrical contacts on the second material layer.

16 Claims, 7 Drawing Sheets

U.S. PATENT DOCUMENTS

2003/0193058 A1* 10/2003 Fried et al. .................. 257/200
2004/0217439 A1* 11/2004 Brian Li et al. ............. 257/528
2006/0046472 A1* 3/2006 Sandhu et al. .............. 438/653

* cited by examiner

REVERSIBLE ELECTRIC FUSE AND ANTIFUSE STRUCTURES FOR SEMICONDUCTOR DEVICES

BACKGROUND OF THE INVENTION

1. Technical Field

The present disclosure relates generally to integrated circuit semiconductor devices. In particular, the present disclosure relates to reversible electronic fuse and antifuse structures for semiconductor devices.

2. Description of Related Art

The proliferation of electronics in our modern world is in large part due to integrated circuit semiconductor devices. Integrated semiconductor devices are designed and used in widely differing applications and there are currently numerous schemes for providing integrated circuit interconnections well known in the art, for example, electrically programmable interconnections for use in integrated circuits. Electrically programmable interconnect schemes include fuses and anti-fuse devices. Fuses are reprogrammable interconnect, which may be altered by a user after initial circuit configuration has been accomplished. Antifuses are one-time programmable, that is, it cannot be reconfigured once initially configured. Fuse and antifuses are widely used in field programmable devices for repairing defective circuitry.

One type of fuse device includes an ohmic element which has a low electrical resistance by default. This type of use may include metal lines such as copper, tungsten or aluminum. When programmed, the electrical resistance will increase significantly and an electrically open condition is achieved. Programming is usually done by a high energy laser during which the fuse material is ablated away. Laser ablation is typically used because it is relatively simple, thus permitting for less complicated design of the fuse element. However, because the laser beam is relatively large, this technique requires enough clearance between the fuse element and the rest of the circuitry to avoid collateral damage.

Another type of fuse device includes an electrically programmable fuse element. These fuses may include poly-silicide having polycrystalline silicon and an overlayer of silicide.

During programming, a high electrical current is passed through the electronic fuse element resulting in the fuse element being heated to a very high temperature. Thus the fuse material is obliterated creating an electrically open state. Yet another type of electronic fuse is one formed on a diode. However, instead of passing a high current as in the previous case, a high voltage is used to break down the semiconductor during programming. Yet another type of electronic fuses is based on electromigration. Current crowding takes place around a fixed location thus initiating electromigration which results in further current crowing and material migration along the direction of the electron movement along the fuse element.

A major advantage of electronic fuse over laser fuse is that the fuse element can be made very small and spacing between the fuse element and the neighboring circuit element can be significantly smaller. However, the design of an electronic fuse is more complicated, particularly in the choice of the material and the integration scheme employed. For example, U.S. Pat. No. 5,973,977 describes an electronic fuse-antifuse structure having a horizontal B-fuse portion and a vertical A-fuse portion disposed between two metallization layers of an integrated circuit device.

An antifuse device includes an antifuse element that is typically electrically non-conductive, i.e. at very high ohmic resistance. When programmed, the electrical resistance of the antifuse decreases significantly. Commonly used antifuse material includes very thin layer of silicon oxide, amorphous silicon. In addition, U.S. Pat. No. 5,610,084 discloses a technique to make very thin (e.g. 5 nm) silicon oxide, by implanting nitrogen into a silicon layer for slowing down the rate of oxidation of the silicon layer.

U.S. Pat. No. 5,794,094 discloses an antifuse structure consisting of a thin layer of amorphous silicon sandwiched in between two metal electrodes. During programming, an electrical voltage is applied across the electrode to induce metal atoms diffuse into the silicon layer leading to a resistance drop from about 20 to 100 ohms.

U.S. Pat. No. 6,344,373 B1 describes yet another antifuse structure wherein the antifuse element consists of a layer of injector layer such as a two phase material (e.g. silicon rich nitride or silicon rich oxide) and a dielectric layer. Initially, the two layers are non-conducting but when a sufficient voltage is applied across the two layers, they will fuse together and become conducting.

Furthermore, some devices incorporate both fuse and antifuse. For example, U.S. Pat. No. 5,903,041 describes a two terminal fuse-antifuse structure having an air-gap. The air-gap provides a space for the disrupted fuse material, thus reducing the physical stress.

Accordingly, a need exist for an apparatus and simplified method of forming electronic fuse and antifuse elements by increasing the current density. These apparatus and methods are desirable for the electrical fuse technology to minimize energy consumption and the cost of programming.

SUMMARY OF THE INVENTION

The present disclosure is directed to a structure and method of forming fuse and antifuse structures in semiconductor devices. In one embodiment, a method of fabricating reversible fuse and antifuse structures in an interconnect structure is described. The method includes forming at least one line having a via opening for exposing a portion of a plurality of interconnect features; conformally depositing a first material layer over the via opening; depositing a second material layer over the first material layer, wherein the depositing overhangs a portion of the second material layer on a top portion of the via opening; and depositing a blanket layer of insulating material, wherein the depositing forms a plurality of fuse elements each having an airgap between the insulating material and the second material layer. The method further includes forming a plurality of electroplates in the insulator material, the electroplates connecting the fuse elements. In one particular embodiment, the electroplates programs the fuse elements. In addition, the at least one line is a damascene line. Alternatively, the at least one line is a dual damascene line. Moreover, the first material layer is a diffusion barrier material, and the second material layer is a fuse material selected from a group consisting of Cu, Ru, Ir, Rh and Pt. In addition, the insulating material plugs at least one of the fuse elements, where the insulating material is selected from a group consisting of a SiN, $SiO_2$, $Si_3N_4$, SiCOH, SiLK, JSR, silsequioxanes and a combination thereof.

In another embodiment, a method of forming an integrated circuit having a fuse and antifuse structure is described, the method including depositing a first and a second material layer on a semiconductor substrate, wherein the second material layer having a higher electrical conductivity than the first material layer; selectively etching the first and second material layer to create at least one constricted region to facilitate electromigration of the second material; wherein the electromigration creates a plurality of micro voids; and forming a plurality of electrical contacts on the second material layer. In this particular embodiment, the first material is selected from a group consisting of Ta, TaN, TiN, Ru, RuN, W and WN; the second material is selected from a group consisting of Cu, Ru, Ir, Rh and Pt; and the electrical contacts include a material selected from a group consisting of Cu, Al, W, TiN, TaN, Ta, and Mo. In addition, the micro voids are configured for facilitating reversibility of an electric current flow.

In yet another embodiment, a fuse structure for semiconductor devices is described. The fuse structure includes a first and second material layers formed on a semiconductor substrate, the second material layer having a higher electrical conductivity than the first material layer; at least one constricted region abutting a portion of the first and second material layers; a plurality of voids formed within the second material layer; and a plurality of current contact positioned on a surface of the second material layer. The at least one constricted region is adapted for facilitating electromigration of the second material layer. In addition, a material migration of the second material layer is included, where the material migration define the plurality of voids for facilitating reversibility of an electric current flow. Moreover, the first material layer is selected from a group consisting of Ta, TaN, TiN, Ru, RuN, W and WN and further wherein the second layer includes is selected from a group consisting of Cu, Ru, Ir, Rh and Pt.

In yet another embodiment, a fuse structure for semiconductor devices is described including a via opening having a first material liner; a second material liner positioned over the first material liner, the second material liner overhanging a portion of the via opening; and a plug uniformly placed over a portion of the second material liner and creating at least one airgap within the via opening. The first material liner is selected from a group consisting of Ta, TaN, TiN, Ru, RuN, W and WN; and the second material liner is selected from a group consisting of Cu, Ru, Ir, Rh and Pt. In this particular embodiment, the overhanging of the second material liner includes a thicker portion of the second material liner. In addition, the plug includes an insulating material where the airgap is enclosed by the second material liner and the insulating material. The insulating material is selected from a group consisting of SiN, $SiO_2$, $Si_3N_4$, SiCOH, SiLK, JSR, silsequioxanes and a combination thereof.

Other features of the presently disclosed structure and method of forming fuse and antifuse structures in semiconductor devices will become apparent from the following detail description taken in conjunction with the accompanying drawing, which illustrate, by way of example, the presently disclosed fuse and antifuse.

BRIEF DESCRIPTION OF THE DRAWINGS

The features of the presently disclosed a structure and method of forming fuse and antifuse structures in semiconductor devices will be described hereinbelow with references to the figures, wherein.

DETAILED DESCRIPTION

Figure 1:
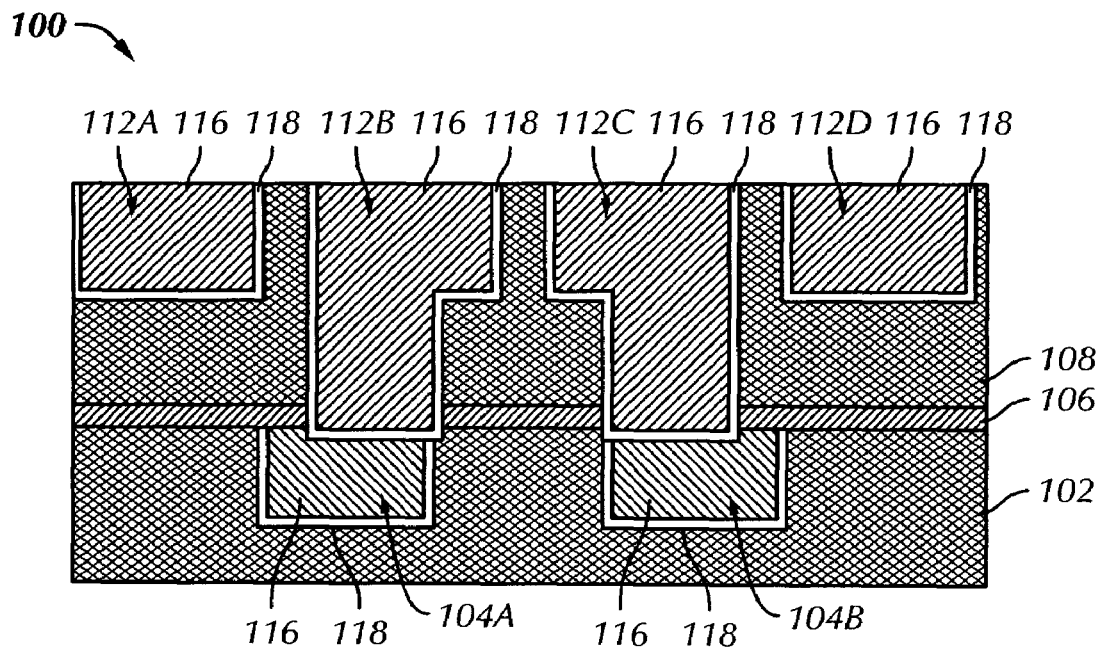
FIG. 1 illustrates a simplified cross-sectional view of an interconnect structure following a chemical-mechanical planarization, according to a first embodiment of the present disclosure.

Referring now to the drawing figures, wherein like references numerals identify identical or corresponding elements throughout the several views, an embodiment of the presently disclosed structure and method of forming fuse and antifuse structures will now be disclosed in detail. In the following description, numerous specific details are set forth, such as particular structures, components, materials, dimensions, processing steps and techniques, in order to provide a thorough understanding of the present invention. However, it will be appreciated by one skilled in the art that the invention may be practiced without these specific details. In other instances, well-known structures or processing steps have not been described in detail to avoid obscuring the invention. The materials described herein are employed to illustrate the present disclosure in one application and should not be construed as limiting.

It will be understood that when a layer is referred to as being "on" or "over" another layer, it can be directly on the other element or intervening layers may also be present. In contrast, when a layer is referred to as being "directly on" or "directly over" another layer, there are no intervening layers present. It will also be understood that when a layer is referred to as being "connected" or "coupled" to another layer, it can be directly connected to or coupled to the other layer or intervening layers may be present.

The present disclosure provides an apparatus and a method for fabricating an integrated circuit having reversible electromigration for enhancing the efficiency of a fuse and antifuse structure. In one embodiment, a vertical sublithographic structure is provided including a fuse and antifuse structure having an airgap therewithin for enhancing programming thereof. The airgap is adapted for reducing the heat loss during programming and for increasing the degree or electromigration. In addition, the apparatus and method is not limited by the capability of the lithographic tool and processes. In a second embodiment, a horizontal stack is provided having a constrict region for crating a region of high material divergence and current density for enhancing the fuse and antifuse action.

The structure described herein can be made using conventional techniques of back end of the line (BEOL) processing known to those skilled in the art. In addition, front end of the line (FEOL) and middle end of the line (MOL) processing are also envisioned.

FIGS. 1-6 illustrate a vertical sub-lithographic structure for forming a compact fuse and antifuse structure having an airgap to enhance the programming of an electronic fuse, in accordance with the present disclosure. With initial reference to FIG. 1, an interconnect structure is illustrated and is designated generally as interconnect structure 100. Interconnect structure 100 includes generally a first dielectric layer 102 formed on a semiconductor substrate (not shown) and containing therewithin a first interconnect features 104A and 104B. A capping layer 106 is provided over first dielectric layer 102 and first interconnect features 104A and 104B. In one embodiment, capping layer 106 includes a thickness ranging from about 15 nm to about 55 nm. A second dielectric layer 108 is disposed on the upper exposed surface of capping layer 106.

Semiconductor substrate may include any of several semiconductor materials well known in the art, such as, for example, a bulk silicon semiconductor substrate, silicon-on-insulator (SOI) and silicon-on-sapphire (SOS). Other non-limiting examples include silicon, germanium, silicon-germanium alloy, silicon carbide, silicon-germanium carbide alloy and compound (i.e. III-V and II-VI) semiconductor materials. Non-limiting examples of compound semiconductor materials include gallium, arsenide, indium arsenide and indium phosphide semiconductor material. Typically, semiconductor substrate may be about, but is not limited to, several hundred microns thick, for example a thickness ranging from about 0.5 mm to about 1.5 mm.

In one embodiment, first dielectric layers 102 include a dielectric constant, k, of about 4.0 or less and a thickness ranging from about 200 nm to about 450 nm. Dielectric layer 102 may include any interlevel or intralevel dielectric, and may be porous or non-porous. Suitable materials include, but are not limited to, SiN, $SiO_2$, $Si_3N_4$, SiCOH, SiLK (a polyarylene ether available from Dow Chemical Corporation), JSR (a spin-on silicon-carbon contained polymer material available from JSR corporation), silsequioxanes, C doped oxides (i.e. organosilicates) that include atoms of Si, C, O, and/or H, thermosetting polyarylene ethers, etc. or layers thereof. It is understood, however, that other materials having different dielectric constant and/or thickness may be employed. Second dielectric layer 108 may include the same or different dielectric material as that of first dielectric material 102. Moreover, the processing techniques and thickness ranges described hereinabove with respect to first dielectric 102 are also applicable to second dielectric 108.

Capping layer 106 is formed through conventional deposition processes, such as, for example, CVD, atomic layer deposition (ALD), physical vapor deposition (PVD), plasma enhanced chemical vapor deposition (PECVD), etc. Capping layer 106 may include any of several materials well known in the art, for example, $Si_3N_4$, SiC, $SiO_2$, and SiC (N, H) (i.e., nitrogen or hydrogen doped silicon carbide), etc.

With continued reference to FIG. 1, lines 112A, 112B, 112C and 112D are formed including damascene lines 112A and 112D and dual damascene lines 112B and 112C, as illustrated by the figure. Dual damascene lines 112B and 112C includes contact vias extending through second dielectric layer 108 and capping layer 106 for connecting with first interconnect features 104A and 104B, respectively.

First interconnect features 104A and 104B and lines 112A, 112B, 112C and 112D include a conductor material 116 and a highly resistive diffusion barrier 118 to prevent conductive material 116 from diffusing. Diffusion barrier 118 is deposited using atomic layer deposition (ALD), or alternatively, a chemical vapor deposition (CVC) may be used. In one embodiment, diffusion barrier includes a thickness ranging from about 4 nm to about 40 nm. Conductor material 116 may be selected from a material including, for example, Cu, Al, W, TiN, TaN, Ta, Mo, their alloys, and any suitable conductive material. Highly resistive diffusion barrier 118 may be selected from a material including Ta, TaN, TiN, Ru, RuN, W, WN, or any other barrier material.

Figure 2:
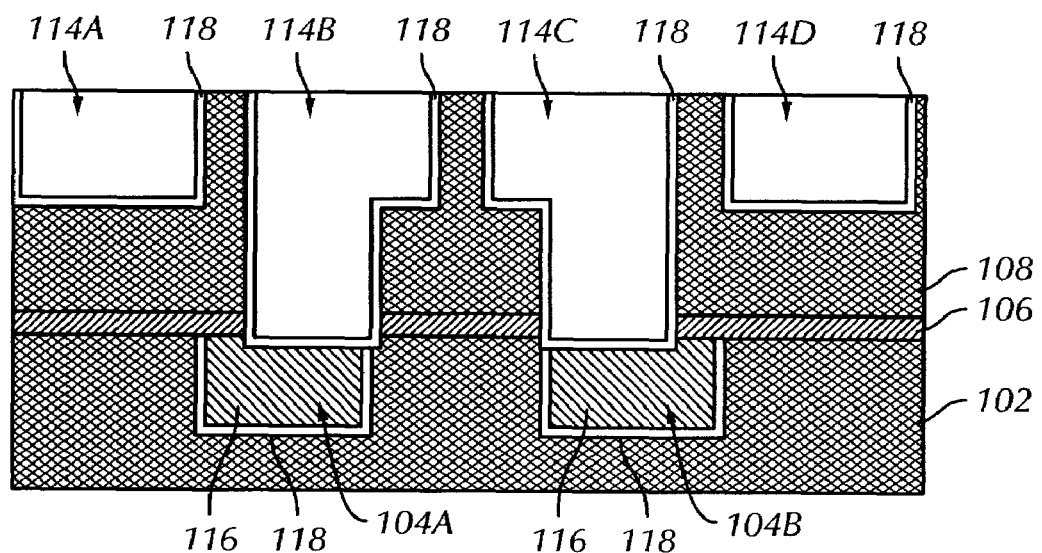
FIG. 2 illustrates the interconnect structure of FIG. 1 following the removal of the conductive material.

With reference to FIG. 2, conductive material 116 is removed from damascene lines 112A, 112B, 112C and 112D through conventional techniques including, for example a combination of acid such as HF, $H_2SO_4$, HCl, $HNO_3$, etc., for defining contact via openings 114A, 114B, 114C and 114D having diffusing barrier 118. Via openings 114B and 114C are configured for exposing a portion of interconnect features 104A and 104B, respectively.

Figure 3:
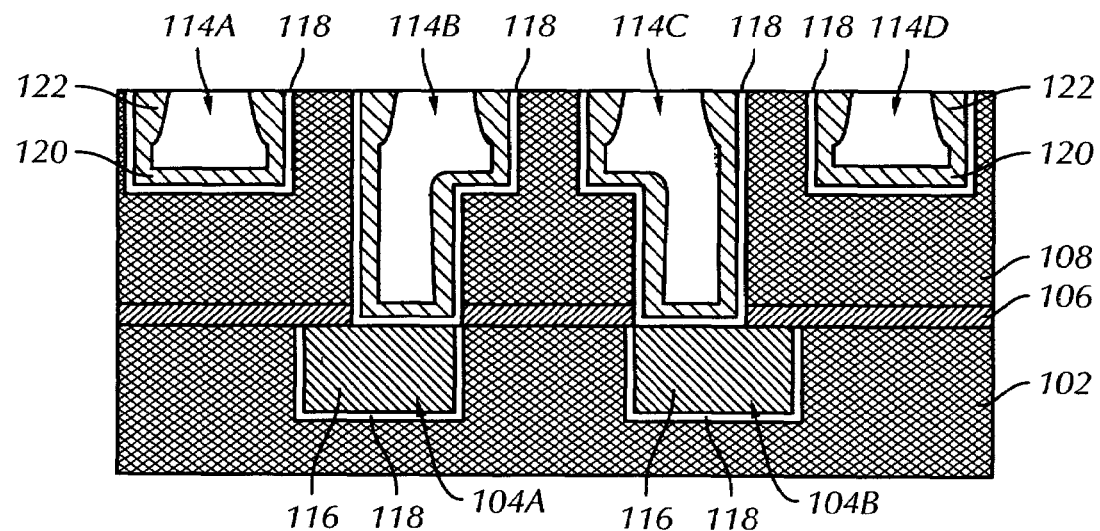
FIG. 3 illustrates the interconnect structure of FIG. 2 following a nonconformal deposition of a fuse material.

With reference to FIG. 3, a fuse material layer 120 is formed within via openings 114A, 114B, 114C and 114D over diffusion barrier 118. In particular, fuse material layer 120 is deposited non-conformally thus overhanging 122 on a top portion of and abutting via openings 114A, 114B, 114C and 114D for creating a high material divergence and a high current density area of a bottom portion of the via openings. In one embodiment, the resultant sheet rho of diffusion barrier 118 and fuse material layer 120 is about 2,000 to 10,000 ohms/square. Fuse material layer 120 may be selected from a material including, for example, Cu, Ru, Ir, Rh, Pt, or any other suitable material. In one embodiment, fuse material 120 includes a thickness ranging from about 10 nm to about 100 nm.

Figure 4:
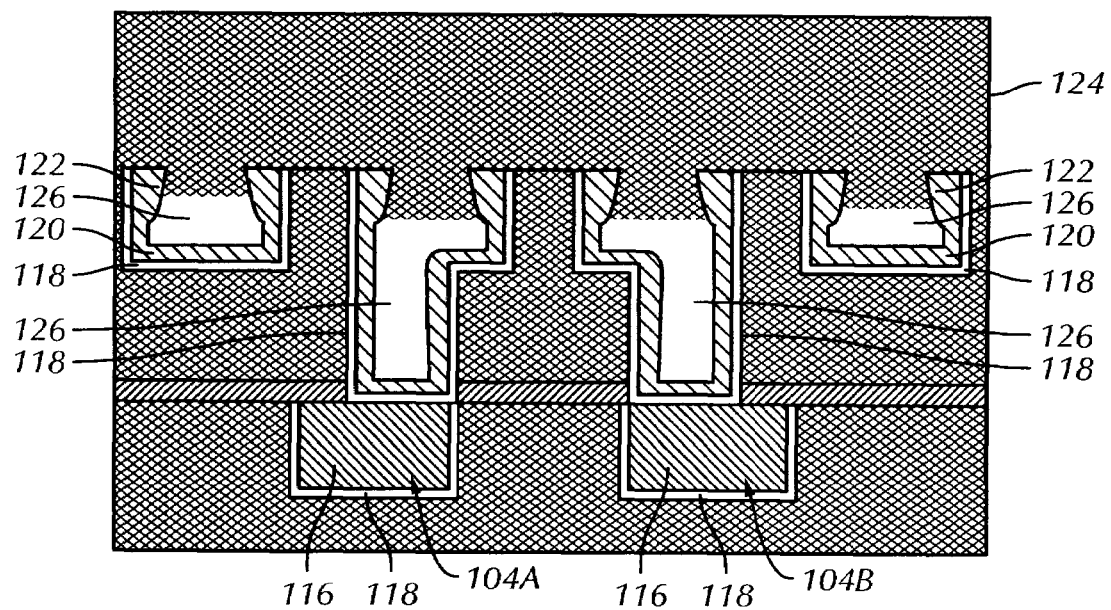
FIG. 4 illustrates the interconnect structure of FIG. 3 following a blanket deposition of a dielectric material.

With reference to FIG. 4, a blanket deposition of a third dielectric layer 124 is formed over structure 100 through, for example, a CVD technique. As illustrated by the figure, third dielectric layer 124 partially fills via openings 114A, 114B, 114C and 114D. In particular, because of overhang portion 122 of via openings 114A, 114B, 114C and 114D and the nature of CVD deposition, a portion of third dielectric layer 124 acts as a plug for creating fuse element 125A, 125B, 125C and 125D, each having airgap 126. Airgaps 126 provide room for the fuse material to expand upon heating and ablation during programming under which a high current density is imparted to the fuse material. Also, compared to a solid plug, the structure of airgaps 126 will dissipate less heat away and indirectly enhance the sensitivity of the programming. Third dielectric layer 124 may comprise the same or different dielectric material as that of first dielectric material layer 102. Moreover, the processing techniques and thickness ranges described hereinabove with respect to first dielectric layer 102 are also applicable to third dielectric layer 124.

Figure 5:
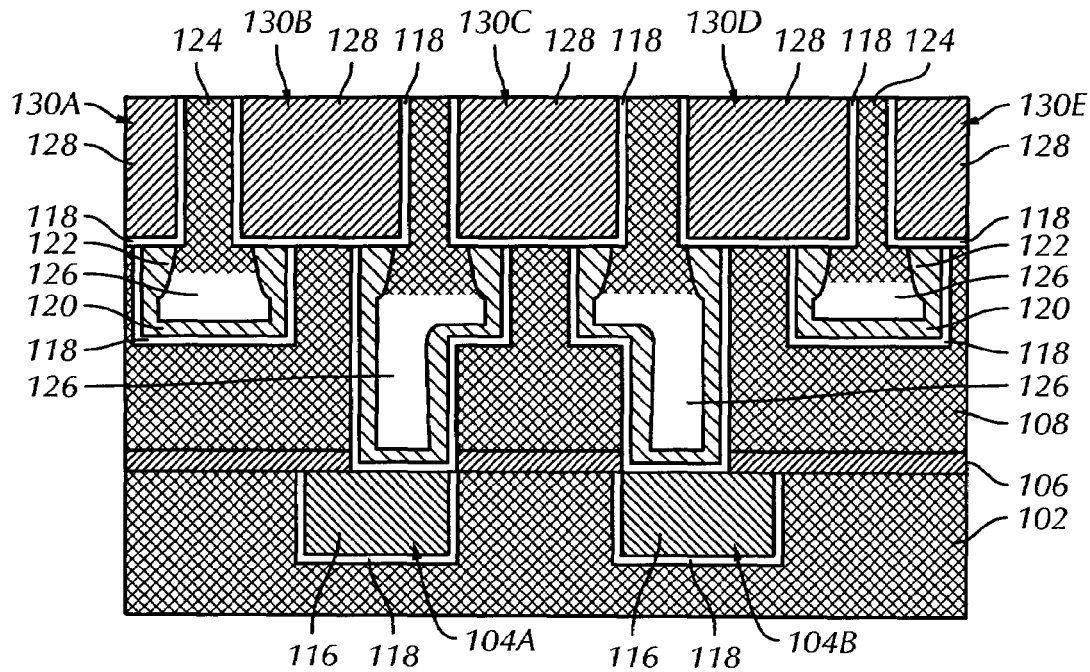
FIG. 5 illustrates the interconnect structure of FIG. 4 following deposition of a conductive material and the formation of an interconnect feature.

With reference to FIG. 5, electroplates 130A, 130B, 130C and 130D are formed in third dielectric layer 124 using standard patterning, through lithographic, etching processes and metallization. Electroplates 130A, 130B, 130C and 130D connect with fuse elements 125A, 125B, 125C and 125D, as illustrated by the figure. In addition, electroplates 130A, 130B, 130C and 130D each include a conductive material 128 and diffusion barrier 118. Conductive material 128 may comprise the same or different materials as that of conductive material 116.

Figure 6:
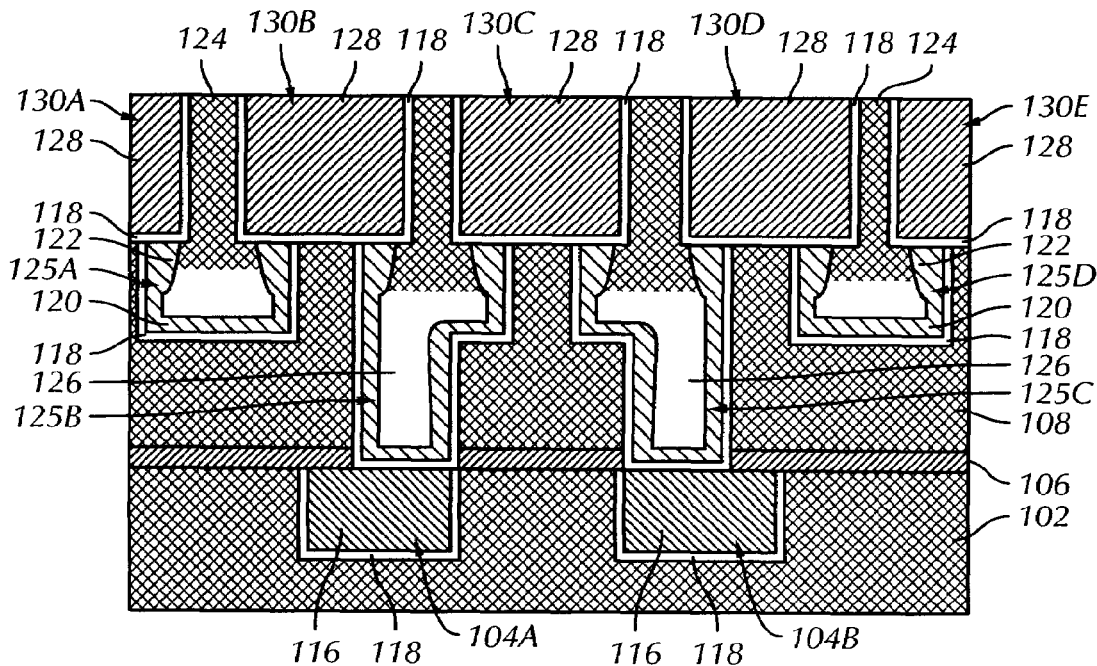
FIG. 6 shows the interconnect structure of FIG. 5 illustrating the programmability of fuse elements.
Figure 13:
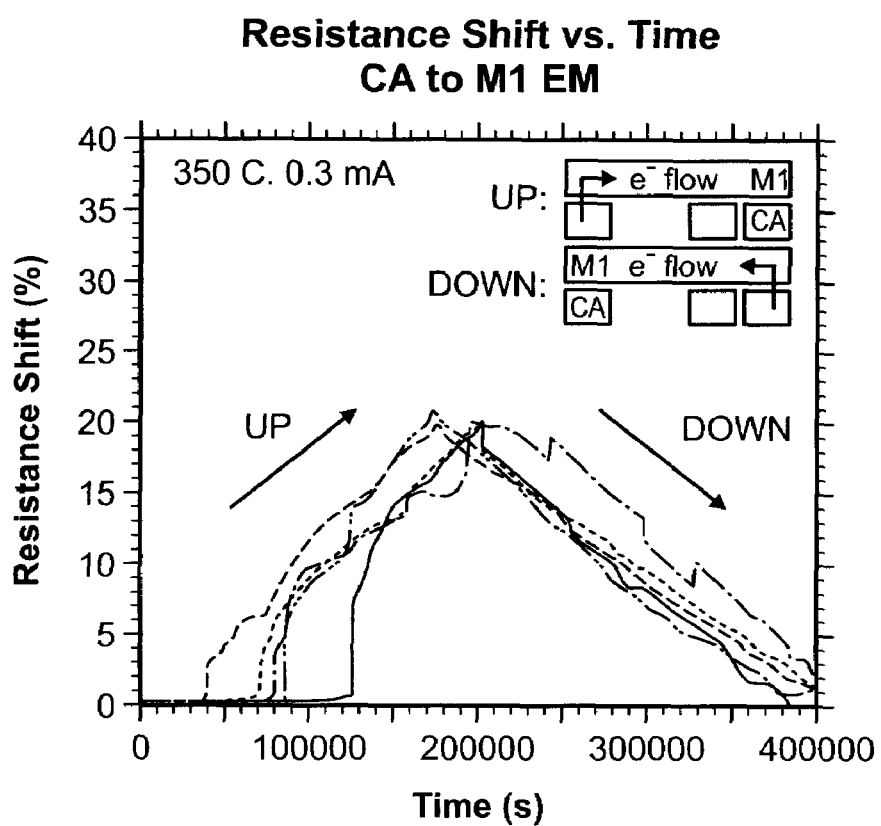
FIG. 13 is a graph of the resistance shift as a function of time illustrating the resistance being modulated by the direction of current flow.

With reference to FIG. 6, electroplates 130A, 130B, 130C and 130D are connected to electroplates 104A and B via electronic fuse elements 125A, 125B, 125C and 125D. In particular, fuse element 125A, for example, can be programmed through interconnect feature 130A and 130B. Similarly, fuse element 125B can be programmed through interconnect feature 130A and 130C or interconnect feature 130B and 104A or interconnect feature 130C and 104A. In addition, fuse element 125C may be programmed through electroplates 130C and 130D or through electroplates 130B and electroplates 104B; or through electroplates 130D and interconnect features 104B. Finally, fuse element 125D may be programmed through electroplates 130D and 130E. Electromigration is the movement of material as a result of momentum transfer between the materials with the flowing electron. As an example, current (electron in opposite direction of current by convention) can flow from about electroplate 130A through fuse element 125A onto electroplate 130B, onto fuse element 125B, then up electroplate 130C, etc. Accompanying the current flow is a migration of material within the chain of conductors. When a sufficient high current density is created within the fuse element, sufficient mass transfer will results in void formation and as a result leading to an increase of electrical resistance, and eventually lead to an open condition within the current conducting chain. In addition, the electromigration can be made reversible by changing the direction of the programming current, as illustrated by FIG. 13. The resistance of electroplates 130A, 130B, 130C and 130D can be increased by inducing electromigration through flowing current into electronic fuse element 125A, 125B, 125C and 125D. The resistance can be reduced back by simply reversing the current flow. Thus fuse and antifuse functionality can be achieved by a single device.

Figure 7:
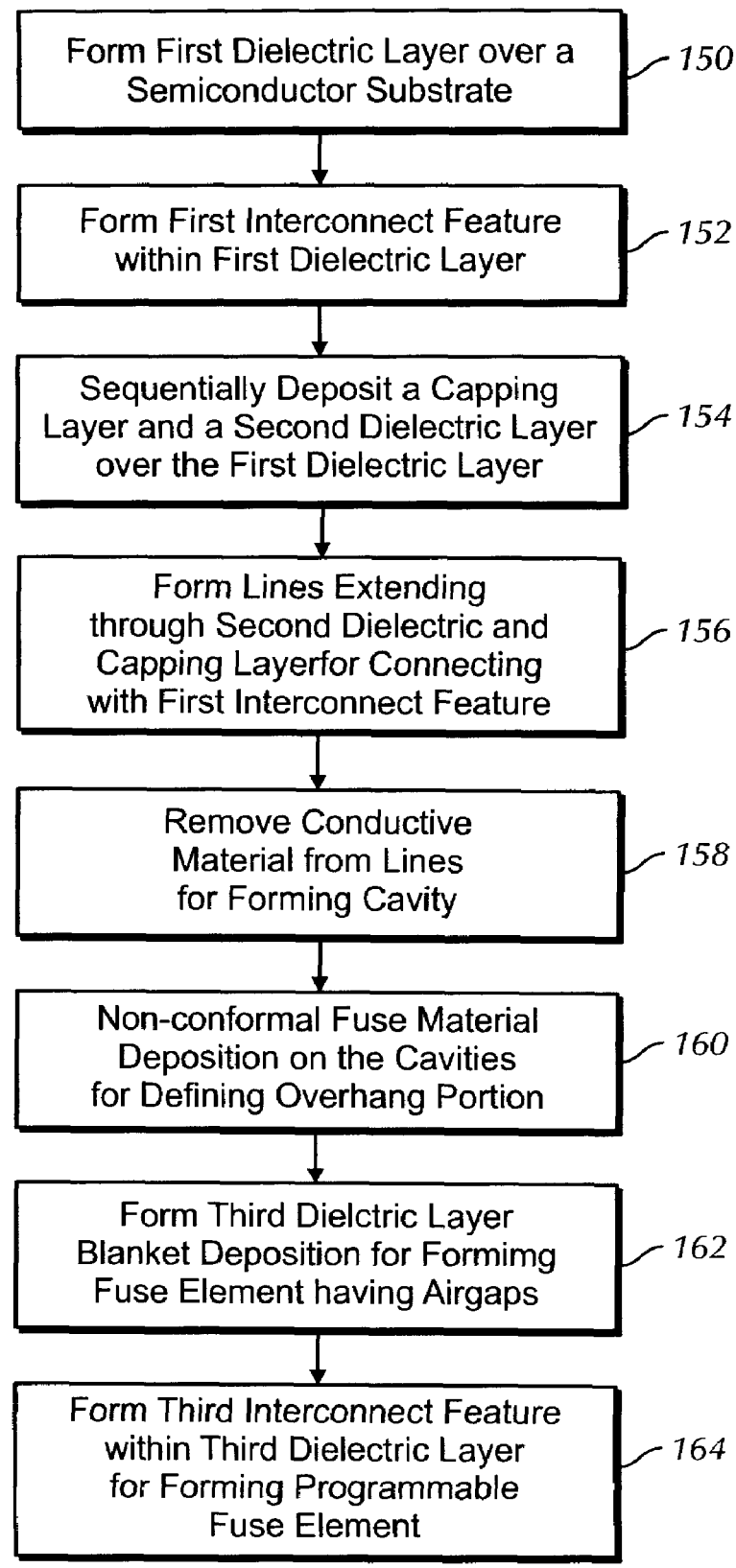
FIG. 7 is a flow diagram illustrating the method for forming fuse and antifuse structures in semiconductor devices according to the embodiment described by FIGS. 1-6.
Figure 8:
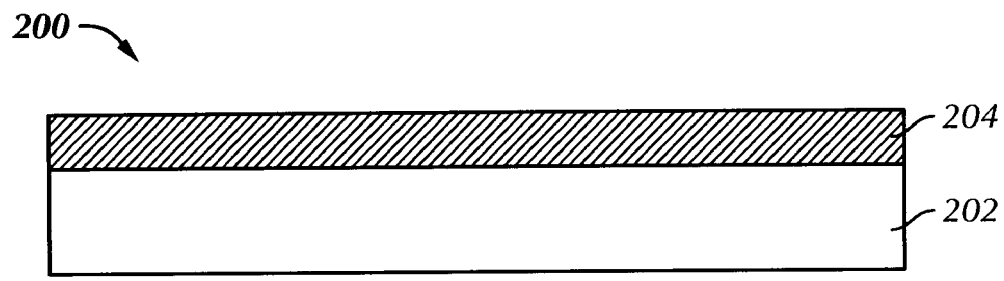
FIG. 8 illustrates a simplified cross-sectional view of a semiconductor substrate having a first electrically resistive material deposited thereon, according to a second embodiment of the present disclosure.

With reference to FIG. 7, in conjunction with FIGS. 1-6, a flow diagram of an exemplary method of fabricating an integrated circuit having reversible fuse and antifuse structures, in accordance with the present disclosure, is illustrated. A device structure, such as, for example, an interconnect structure 100 is provided. In accordance with the present disclosure, initially, at step 150 a first dielectric layer 102 is formed on a semiconductor substrate. At step 152 first interconnect features 104A and 104B are formed within first dielectric layer 102. At step 154, a capping layer 106 and a second dielectric layer 108 are sequentially deposited over first dielectric 102. At step 156, lines 112A, 112B, 112C and 112D are formed extending through second dielectric layer 108 and capping layer 106 for connecting with first interconnect features 104A and 104B. At step 158, a conductive material 116 is removed through a wet etching process from lines 112A, 112B, 112C and 112D thus forming cavities 114A, 114B, 114C and 114D. At step 160 a non-conformal fuse material deposition is formed on cavities 114A, 114B, 114C and 114D for defining overhang portion 122 of cavities 114A, 114B, 114C and 114D. At step 162, a blanket deposition of a third dielectric layer 124 is the formed using CVD technique for defining fuse elements 125A, 125B, 125C and 125D having airgap 126. At step 164 an interconnect features 130A, 130B, 130C and 130D are formed within third dielectric layer 124 for connecting with fuse elements 125A, 125B, 125C and 125D. Fuse elements 125A, 125B, 125C and 125D are then programmed.

With reference to FIGS. 8-12, a second embodiment of an integrated circuit having reversible electromigration for enhancing the efficiency of a fuse and antifuse structure is described. In this particular embodiment, a parallel stack with a constrict region is formed on a semiconductor substrate for forming a region of high material divergence and current density to enhance the fuse and antifuse action. With initial reference to FIG. 8, an electrical structure is provided and is designated generally as electrical structure 200. Electrical structure 200 includes a highly resistive material 204 having a thickness ranging from about 20 nm to about 200 nm formed on a semiconductor substrate 202. The combined sheet rho of the stack formed by semiconductor substrate 202 and resistive material 200 ranges from about 2,000 to about 10,000 ohms/square. Highly resistive material 204 includes, for example doped Poly or Ge or SiGe, or a single crystal Si, etc. In addition, similar to diffusion barrier 118, resistive material 204 may be selected from a material including Ta, TaN, TiN, Ru, RuN, W, WN.

Figure 9:
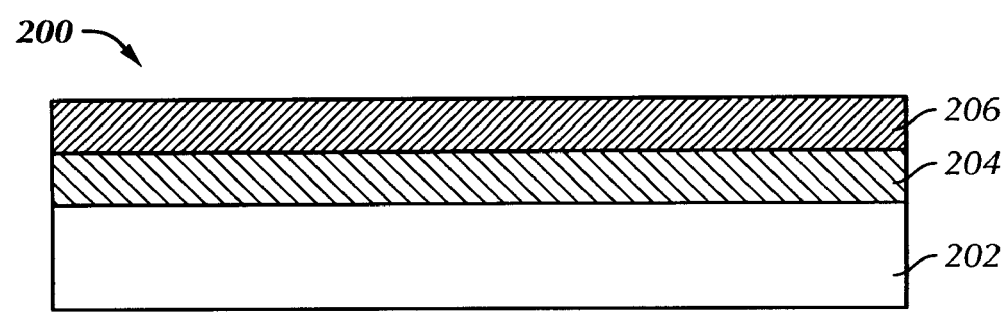
FIG. 9 illustrates the semiconductor substrate of FIG. 8 following a blanket deposition of a second electrically resistive material.

With reference to FIG. 9, an electrically conductive material 206 is deposited over resistive material 204 for defining a stack having a combined sheet rho ranging from about 200 to about 2,000 ohms/square. Conductive material 206 may be deposited by sputtering, evaporation, CVD or ALD. In another embodiment, conductive material 206 includes a Nickel silicide, which is deposited by co-sputtering Ni and Si and then reacted to form silicide by thermal annealing.

Figure 10:
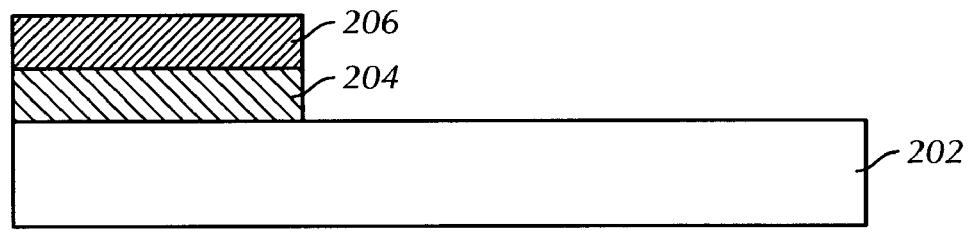
FIG. 10 illustrates the semiconductor substrate of FIG. 9 following photoresist patterning and reactive ion etch.
Figure 12:
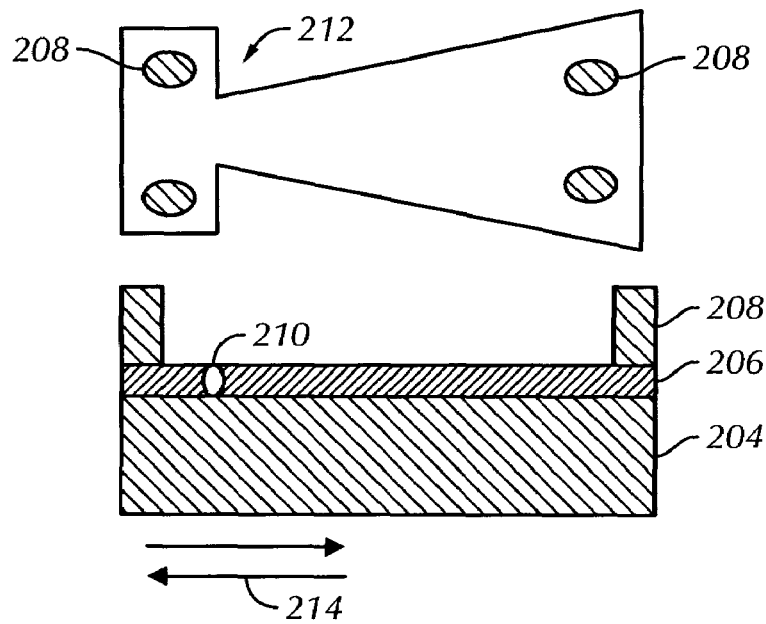
FIG. 12 illustrates a simplified top and cross sectional views of the semiconductor substrate of FIG. 11 having taper design of fuse and antifuse structure.

With reference to FIG. 10, in conjunction with FIG. 12, resistive material 204 and conductive material 206 are patterned using standard lithography steps followed by RIE process for selectively etching a portion of resistive material 204 and conductive material 206 and for defining a trapezoidal shape having a constriction region 212 (FIG. 12). Reactive ion etching of TiN can be done in an $Ar/CF_3/CC_{13}$ or $CBr_3$ chemistry. If nickel silicide is used, it is easier to deposit blanket silicon first, then do litho and standard Si etch to define the trapezoidal shape Si followed by blanket Nickel or Nickel alloy deposition such as sputtering. Nickel monosilicide will be formed by subjecting the substrate to a RTA process (300-450 C for 30 seconds up to 2 minutes). Unreacted Nickel can be stripped of by various wet etchant including but not limited to nitric acid, nitric acid-acetic acid mixture.

Figure 11:
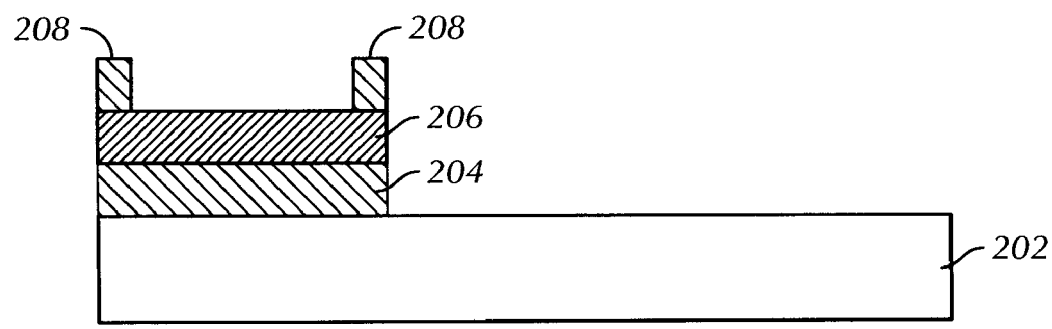
FIG. 11 illustrates the semiconductor substrate of FIG. 10 following formation of a plurality of electrical contacts.

With reference to FIG. 11, electrical contacts 208 are formed by a blanket deposition of a conductive material, for example, by sputtering, evaporation, CVD, ALD, electroless or electrolytic plating. The conductive material may includes, for example, Cu, Al, W, TiN, TaN, Ta, Mo, their alloys, and any suitable conductive material. A standard lithographic masking and RIE is then followed. In an embodiment where the conductive material includes Cu, a standard damascene process may be followed. Alternatively, a thorough-mask electrolytic plating followed by wet etching of the conductive material may be performed.

With reference to FIG. 12, a simplified top and cross sectional views of the semiconductor substrate of FIG. 11 is illustrated having a taper design of fuse and antifuse structure, in accordance with the present disclosure. Macro void elements 210 are formed as a result of electromigration in the fuse and antifuse structure as electric current flow through the structure from one end to the other end. A very high resistance results if a high concentration of macro void elements 210 are created at construct region 212. Void elements 210 may be swept away from taper portion 214 and resistance will be decreased as void elements 210 become a less volume fraction of the much broader section. The structure 200 having construct region 212 creates a region of high material divergence and current density to enhance the fuse and antifuse action. It is noted that structure 200 is reversible, as indicated by directional arrows 214.

With reference to FIG. 13, an experimental data shows resistance measurements from the fuse andti-fuse structure shown in FIG. 12. During the forward-current stress, resistance of this structure increases with time due to electromigration effect. However, resistance of the structure is "recovered," i.e. decrease, during the reverse current stress. This data demonstrate the feasibility of the structure shown in FIG. 12 for fuse and antifuse applications.

Figure 14:
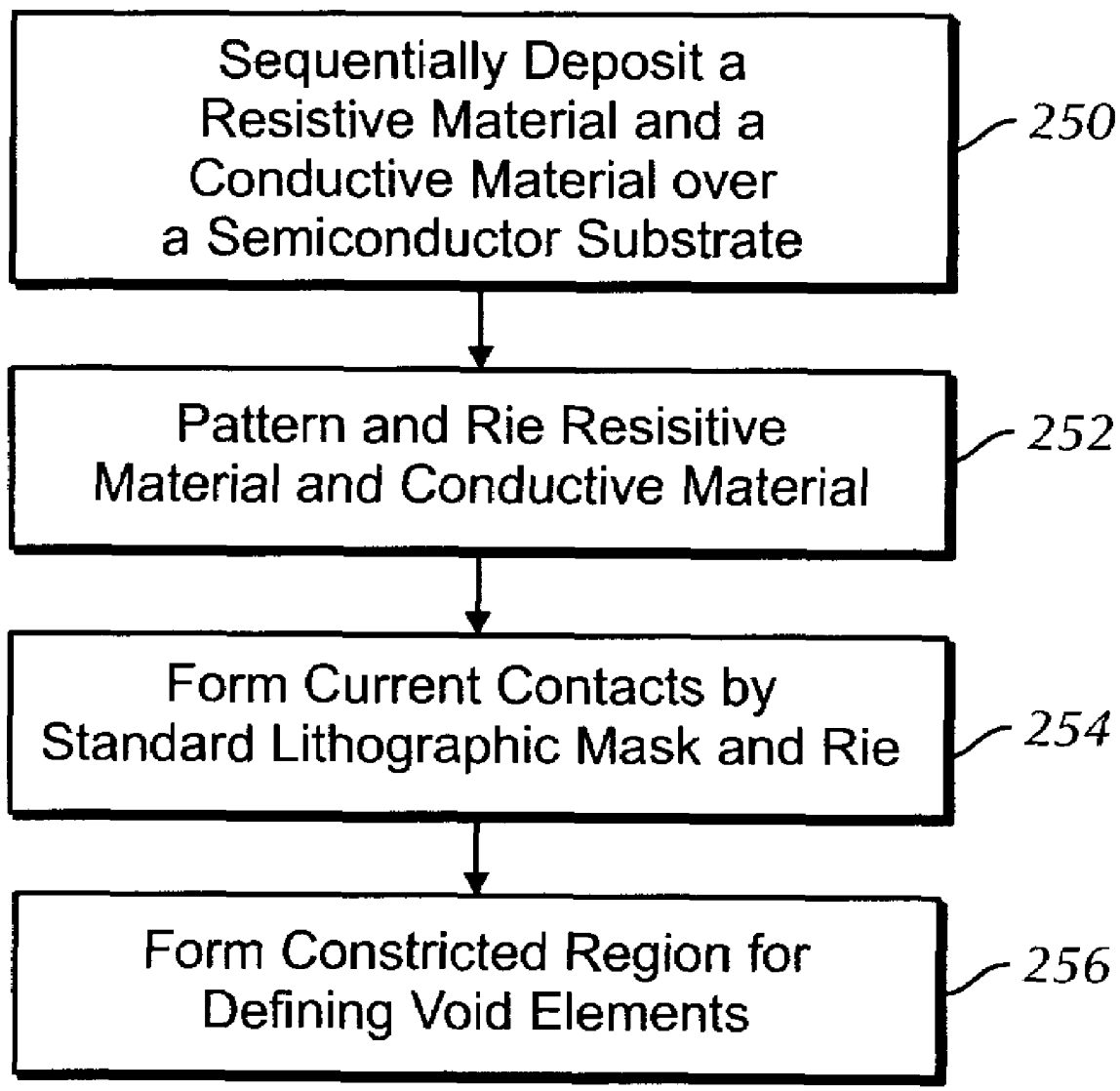
FIG. 14 is a flow diagram illustrating the method for forming fuse and antifuse structures in semiconductor devices according to the embodiment described by FIGS. 8-12.

With reference to FIG. 14, in conjunction with FIGS. 8-12, a flow diagram of an exemplary method of fabricating a reversible fuse and antifuse structure having a constriction region, in accordance with the present disclosure, is illustrated. In accordance with the present disclosure, initially at step 250, a resistive material 204 and a conductive material 206 is sequentially formed over a semiconductor substrate 202. At step 252, resistive material 204 and conductive material 206 are patterned and a RIE process is followed for etching a portion thereof. At step 254 electrical contacts 208 are formed through conventional lithographic mask and RIE. Finally, at step 256, constriction region 212 is formed for defining material divergence and forming void elements 210.

It will be understood that numerous modifications and changes in form and detail may be made to the embodiments of the presently disclosed structure and method of forming reversible electronic fuses and antifuse structures for semiconductor devices. It is contemplated that numerous other configuration of the fuse and antifuse structures may be used, and the material of the structures and method may be selected from numerous materials other than those specifically disclosed. Therefore, the above description should not be construed as limiting the disclosed structure and method, but merely as exemplification of the various embodiments thereof. Those skilled in the art will envisioned numerous modifications within the scope of the present disclosure as defined by the claims appended hereto. In short, it is the intent of the Applicants that the scope of the patent issuing herefrom will be limited only by the scope of the appended claims. Having thus complied with the details and particularity required by the patent laws, what is claimed and desired protected is set forth in the appended claims.

What is claimed is:

1. A method of fabricating reversible fuse and antifuse structures in an interconnect structure, the method comprising:
   forming at least one line having a via opening for exposing a portion of a plurality of interconnect features;
   conformally depositing a first material layer over said via opening;
   depositing a second material layer over said first material layer, wherein said depositing overhangs a portion of said second material layer on a top portion of said via opening and further wherein said second material layer does not form outside said via opening; and
   depositing a blanket layer of insulating material, wherein said depositing forms a plurality of fuse elements each having an airgap between said insulating material and said second material layer.

2. The method of fabricating reversible fuse and antifuse structures as recited in claim 1, wherein said at least one line is a damascene line.

3. The method of fabricating reversible fuse and antifuse structures as recited in claim 1, wherein said at least one line is a dual damascene line.

4. The method of fabricating reversible fuse and antifuse structures as recited in claim 1, wherein said first material layer is a diffusion barrier material.

5. The method of fabricating reversible fuse and antifuse structures as recited in claim 1, wherein said second material layer is a fuse material selected from a group consisting of Cu, Ru, Ir, Rh and Pt.

6. The method of fabricating reversible fuse and antifuse structures as recited in claim 1, wherein said insulating material plugs at least one of said fuse elements.

7. The method of fabricating reversible fuse and antifuse structures as recited in claim 1, wherein said insulating material is selected from a group consisting of a SiN, $SiO_2$, $Si_3N_4$, SiCOH, silsequioxanes and a combination thereof.

8. The method of fabricating reversible fuse and antifuse structures as recited in claim 1, further comprising forming a plurality of electroplates in said insulating material, said electroplates connecting said fuse elements.

9. The method of fabricating reversible fuse and antifuse structures as recited in claim 8, wherein said electroplates programs said fuse elements.

10. A fuse for semiconductor devices comprising:
    a via opening having a first material liner;
    a second material liner positioned over said first material liner, said second material liner overhanging a portion of said via opening; and
    a plug uniformly placed over a portion of said second material liner and creating at least one airgap within said via opening
    wherein said second material layer does not form outside said via opening.

11. The fuse as recited in claim 10, wherein said first material liner is selected from a group consisting of Ta, TaN, TiN, Ru, RuN, W and WN.

12. The fuse as recited in claim 10, wherein said second material liner is selected from a group consisting of Cu, Ru, Ir, Rh and Pt.

13. The fuse as recited in claim 10, wherein said overhanging of said second material liner includes a thicker portion of said second material liner.

14. The fuse as recited in claim 10, wherein said plug includes an insulating material.

15. The fuse as recited in claim 14 wherein said airgap is enclosed by said second material liner and said insulating material.

16. The fuse as recited in claim 14, wherein said insulating material is selected from a group consisting of SiN, $SiO_2$, $Si_3N_4$, SiCOH, silsequioxanes and a combination thereof.

* * * * *